(12) United States Patent
Imai et al.

(10) Patent No.: US 11,315,789 B2
(45) Date of Patent: Apr. 26, 2022

(54) METHOD AND STRUCTURE FOR LOW DENSITY SILICON OXIDE FOR FUSION BONDING AND DEBONDING

(71) Applicant: Tokyo Electron Limited, Tokyo (JP)

(72) Inventors: Kiyotaka Imai, Tokyo (JP); Hirokazu Aizawa, Albany, NY (US); Hiroshi Maeda, Koshi (JP); Kaoru Maekawa, Albany, NY (US); Yuji Mimura, Koshi (JP); Harunobu Suenaga, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/573,775

(22) Filed: Sep. 17, 2019

(65) Prior Publication Data

US 2020/0343092 A1    Oct. 29, 2020

Related U.S. Application Data

(60) Provisional application No. 62/837,993, filed on Apr. 24, 2019.

(51) Int. Cl.
*H01L 21/20* (2006.01)
*H01L 21/50* (2006.01)

(52) U.S. Cl.
CPC .......... *H01L 21/2007* (2013.01); *H01L 21/50* (2013.01)

(58) Field of Classification Search
CPC ............. H01L 2924/00; H01L 21/6835; H01L 21/76254; H01L 22/20; H01L 25/0657; H01L 2224/83205; H01L 2224/83894
See application file for complete search history.

(56) References Cited

U.S. PATENT DOCUMENTS

| | | | | |
|---|---|---|---|---|
| 6,875,671 B2 * | 4/2005 | Faris | ....................... | H01L 22/20 438/455 |
| 7,033,910 B2 * | 4/2006 | Faris | ................... | B81C 1/00119 438/455 |
| 7,056,751 B2 * | 6/2006 | Faris | ................... | B81C 99/0045 438/11 |
| 7,163,826 B2 * | 1/2007 | Faris | ....................... | H01L 22/20 435/455 |
| 10,256,147 B2 * | 4/2019 | Schrems | ................. | H01L 21/78 |
| 10,672,674 B2 * | 6/2020 | Yu | ........................... | H01L 22/22 |
| 2007/0128827 A1 * | 6/2007 | Faris | ....................... | H01L 24/06 438/455 |

(Continued)

*Primary Examiner* — Jaehwan Oh
(74) *Attorney, Agent, or Firm* — Weihrouch IP (57) ABSTRACT

Described herein is a method of bonding and/or debonding substrates. In one embodiment, at least one of the surfaces of the substrates to be bonded is comprised of an oxide. In one embodiment, the surfaces of both substrates comprise an oxide. A wet etch may then be utilized to debond the substrates by etching away the layers that have been bonded. In one embodiment, a fusion bonding process is utilized to bond two substrates, at least one substrate having a silicon oxide surface. In one exemplary etch, a dilute hydrofluoric (DHF) etch is utilized to etch the bonded silicon oxide surface, allowing for two bonded substrates to be debonded. In another embodiment, the silicon oxide may be a low density silicon oxide. In one embodiment, both substrates may have a surface layer of the low density silicon oxide which may be fusion bonded together.

20 Claims, 5 Drawing Sheets

(56) References Cited

U.S. PATENT DOCUMENTS

| | | | |
|---|---|---|---|
| 2007/0135013 A1* | 6/2007 | Faris | H01J 43/246 |
| | | | 445/49 |
| 2008/0160274 A1* | 7/2008 | Dang | G01B 9/02051 |
| | | | 428/220 |
| 2017/0179155 A1* | 6/2017 | Or-Bach | H01L 27/249 |
| 2017/0200715 A1* | 7/2017 | Sekar | H01L 21/76254 |
| 2018/0190619 A1* | 7/2018 | Sekar | H01L 23/481 |
| 2019/0043914 A1* | 2/2019 | Von | H01L 21/187 |
| 2020/0075444 A1* | 3/2020 | Luo | H01L 23/3114 |

\* cited by examiner

METHOD AND STRUCTURE FOR LOW DENSITY SILICON OXIDE FOR FUSION BONDING AND DEBONDING

This application claims priority to U.S. Provisional Patent Application No. 62/837,993 entitled "Method And Structure for Low Density Silicon Oxide for Fusion Bonding and Debonding", filed Apr. 24, 2019; the disclosure of which is expressly incorporated herein, in its entirety, by reference.

BACKGROUND

The present disclosure relates to the processing of substrates. In particular, it provides a novel method for bonding and debonding substrates.

Figure 1:
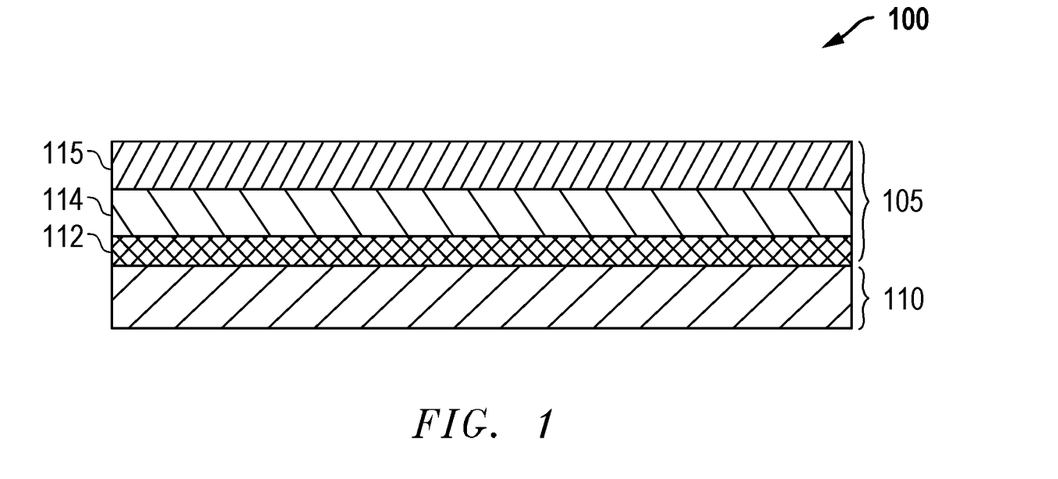
FIG. 1 illustrates an exemplary multi-substrate structure.

Bonding of substrates is utilized in a variety process flows for processing substrates. For example substrate bonding may be utilized as part of a process flow when forming microelectromechanical systems (MEMS), nanoelectromechanical systems (NEMS), optoelectronics, silicon on insulator substrates, multi-layer devices, three dimensional devices, and other semiconductor devices. In substrate bonding typically two substrates are bonded together. FIG. 1 illustrates one exemplary substrate bonding configuration for a multi-substrate structure 100. As shown in FIG. 1, an upper substrate 105 and a lower substrate 110 are provided.

As shown in FIG. 1, two substrates are bonded together. In FIG. 1, the upper substrate 105 (for example an upper wafer) has both a front-side device area 112 and a back-side device area 114 and an additional back-side area 115. In one example process flow, the upper wafer may have been subjected to processing to form the front-side devices and then the upper wafer may be flipped and bonded to a lower wafer so as to allow processing of the backside device areas. Such a process flow is, however, merely exemplary and there are many other process flows and uses of substrate bonding as is known in the art.

There are a wide variety of techniques utilized to bond substrates together, including fusion bonding (also known as direct bonding), anodic bonding, eutectic bonding, thermoscompression bonding, surface activated bonding, plasma activated bonding, adhesive bonding, etc. Conventional adhesive bonding often uses a glue thickness of around 30 um or thicker. Such techniques are advantages in that adhesive bonding is easy to debond with mechanical, thermal or laser techniques. However the thick films used in adhesive bonding have a high total thickness variation (TTV) that makes subsequent fine pitch lithography patterning difficult. In addition, post-bonding processing conditions are temperature limited by the thermal characteristics of the adhesive. Fusion (or direct) bonding is one commonly used type of bonding. In fusion bonding, chemical bonds are formed between the two surfaces of the two substrates. Typically, a fusion bonding process includes cleaning the substrate surfaces and aligning the substrates and then some form of annealing (either at high or low temperatures) of the substrates is used to complete the chemical bond. One technique for fusion bonding has the surfaces of the two substrates being silicon, though other materials may be utilized for fusion bonding.

In some advanced substrate processing flows, it may be desirable to debond the substrates after backside processing of one of the substrates is completed. Due to the strong bonding characteristics of fusion bonding, however, debonding is difficult when using fusion bonding.

It would be desirable to provide a bonding process technique that provides good bonding characteristics but allows for ease of debonding.

SUMMARY

Described herein is an innovative method for bonding and/or debonding substrates. In one embodiment, at least one of the surfaces of the substrates to be bonded is comprised of an oxide. In one embodiment, the surfaces of both substrates comprise an oxide. Fusion bonding of the substrates may then be performed. Subsequently, a wet etch may then be utilized to debond the substrates by etching away the layers that have been bonded. In one embodiment, a fusion bonding process is utilized to bond two substrates, at least one substrate having a silicon oxide surface. In one exemplary etch, a dilute hydrofluoric acid (DFH) etch is utilized to etch the bonded silicon oxide surface, allowing for two bonded substrates to be debonded. In one embodiment, the silicon oxide may be a low density silicon oxide. In one embodiment, both substrates may have a surface layer of the low density silicon oxide which may be fusion bonded together.

In one embodiment, a method for processing a first substrate and a second substrate is disclosed. The method comprises providing an oxide surface layer on at least one of the first substrate and the second substrate. The method further comprises fusion bonding the first substrate and the second substrate. The method further comprises debonding the first substrate and the second substrate through the use of an oxide etchant.

In some embodiments of the method, the oxide surface layer comprises silicon oxide. In some embodiments, the oxide etchant comprises a wet oxide etchant. The oxide etchant may comprise hydrofluoric acid. In some embodiments, the oxide etchant comprises diluted hydrofluoric acid. In other embodiments, the first substrate has a first oxide surface layer and the second substrate has a second oxide surface layer. In some embodiments, the first oxide surface layer comprises silicon oxide and the second oxide surface layer comprises silicon oxide. In some embodiments, the fusion bonding forms Si—O—Si bonds.

In another embodiment, a multi-substrate structure is disclosed. The multi-substrate structure may comprise a first semiconductor wafer and a second semiconductor wafer. The multi-substrate structure further comprises a silicon oxide layer between the first semiconductor wafer and the second semiconductor wafer, the first semiconductor wafer and the second semiconductor wafer being fusion bonded together by the silicon oxide layer.

In some embodiments of the multi-substrate structure, one of the first semiconductor wafer and the second semiconductor wafer had a silicon oxide surface prior to the first semiconductor wafer and the second semiconductor wafer being fusion bonded. In other embodiments, prior to the first semiconductor wafer and the second semiconductor wafer being fusion bonded, the first semiconductor wafer had a first silicon oxide surface and the second semiconductor wafer had a second silicon oxide surface. In yet another embodiment, the silicon oxide layer forms Si—O—Si bonds between the first semiconductor wafer and the second semiconductor wafer. In still another embodiment of the multi-substrate structure, at least a first portion of the silicon oxide layer is part of the first semiconductor wafer and a second portion of the silicon oxide layer is part of the second semiconductor wafer. In still another embodiment at least one of the first or second semiconductor wafers comprises a front-side processing area and a back-side processing area.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Described herein is an innovative method for bonding and/or debonding substrates. In one embodiment, at least one of the surfaces of the substrates to be bonded is comprised of an oxide. In one embodiment, the surfaces of both substrates comprise an oxide. Fusion bonding of the substrates may then be performed. Subsequently, a wet etch may then be utilized to debond the substrates by etching away the layers that have been bonded. In one embodiment, a fusion bonding process is utilized to bond two substrates, at least one substrate having a silicon oxide surface. In one exemplary etch, a dilute hydrofluoric (DHF) etch is utilized to etch the bonded silicon oxide surface, allowing for two bonded substrates to be debonded. In one embodiment, the silicon oxide may be a low density silicon oxide. In one embodiment, both substrates may have a surface layer of the low density silicon oxide which may be fusion bonded together.

The techniques disclosed herein may be utilized during the processing of a wide range of substrates. The substrate may be any substrate for which the use of substrate bonding and/or debonding is desirable. In one embodiment, at least one substrate may be a substrate that has been subject to multiple semiconductor processing steps which yield a wide variety of structures and layers, all of which are known in the substrate processing art, and which may be considered to be part of the substrate. For example, in one embodiment, the substrate may be a semiconductor wafer having one or more semiconductor processing layers formed thereon. The concepts disclosed herein may be utilized at any stage of the substrate process flow, for example front end of line (FEOL) processing steps and/or back end of line (BEOL) processing steps. In some embodiments, one of the substrates may merely be a carrier substrate. In some embodiments, the carrier substrate may be utilized to hold the other substrate while the other substrate is being processed (for example backside processing).

Figure 2A:
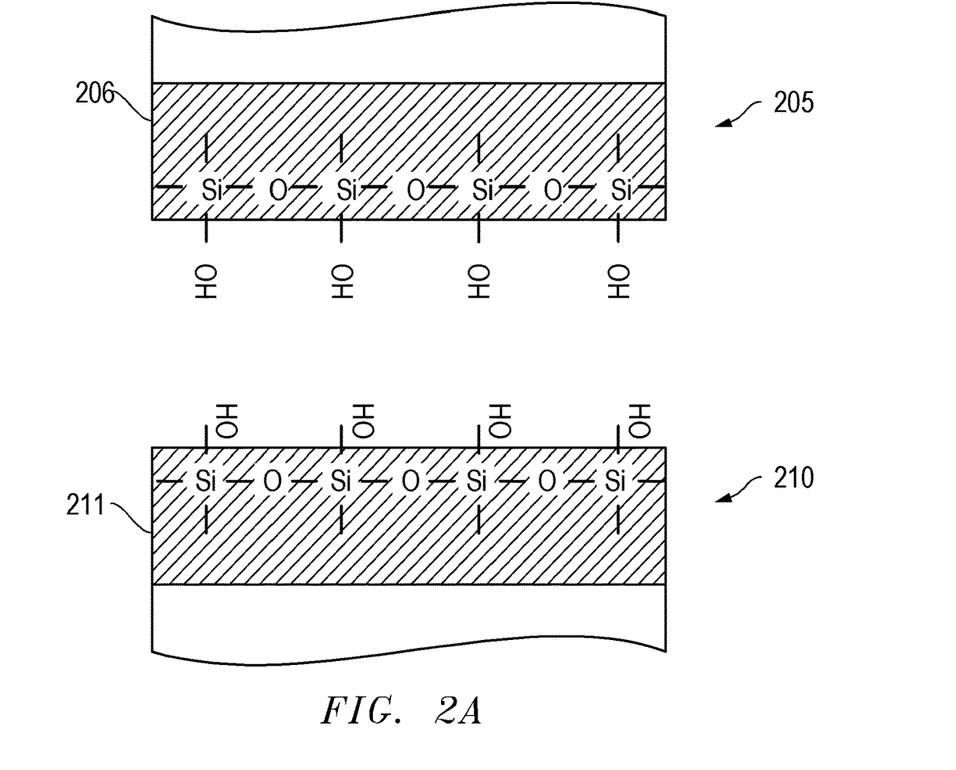
FIG. 2A illustrates two substrates prior to bonding configured according to the techniques disclosed herein.
Figure 2B:
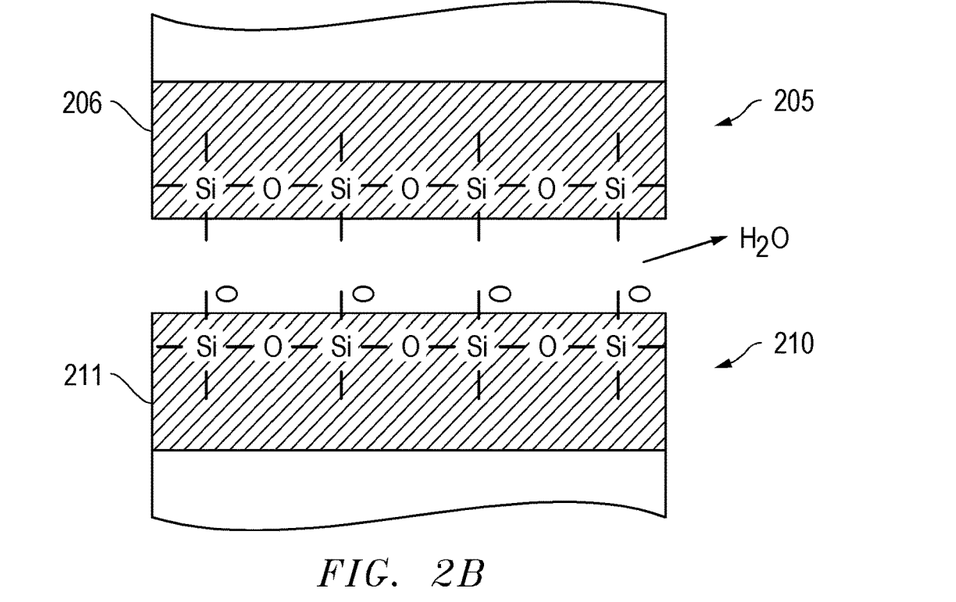
FIG. 2B illustrates the two substrates of FIG. 2A after bonding.

In one embodiment, both an upper substrate (for example an upper wafer) and a lower substrate (for example a lower wafer) each have an exposed oxide surface (for example a silicon oxide surface). FIG. 2A illustrates such an arrangement in which an upper substrate 205 has an upper substrate oxide surface 206 and a lower substrate 210 has a lower substrate oxide surface 211. FIG. 2B illustrate the fusion bonding of the upper substrate 205 and the lower substrate 210. More particularly, FIG. 2A illustrates each substrate and the exposed surface before bonding. As shown in FIG. 2B, after a fusion bonding dehydration condensation process, the two substrates become bonded by making Si—O—Si bonds between the two substrates. In the exemplary embodiment shown, both the upper and lower substrates have an oxide layer. However, it will be recognized that the techniques disclosed herein may still be utilized even if only one surface has an exposed oxide layer. Moreover, in the exemplary embodiments shown, a silicon oxide layer is utilized for bonding the substrates. It will be recognized that the techniques disclosed herein may be utilized with other oxides including, for example but not limited to silicon oxide carbide (SiOC), SiCOH, silicon oxynitride (SiON), etc.

Figure 3A:
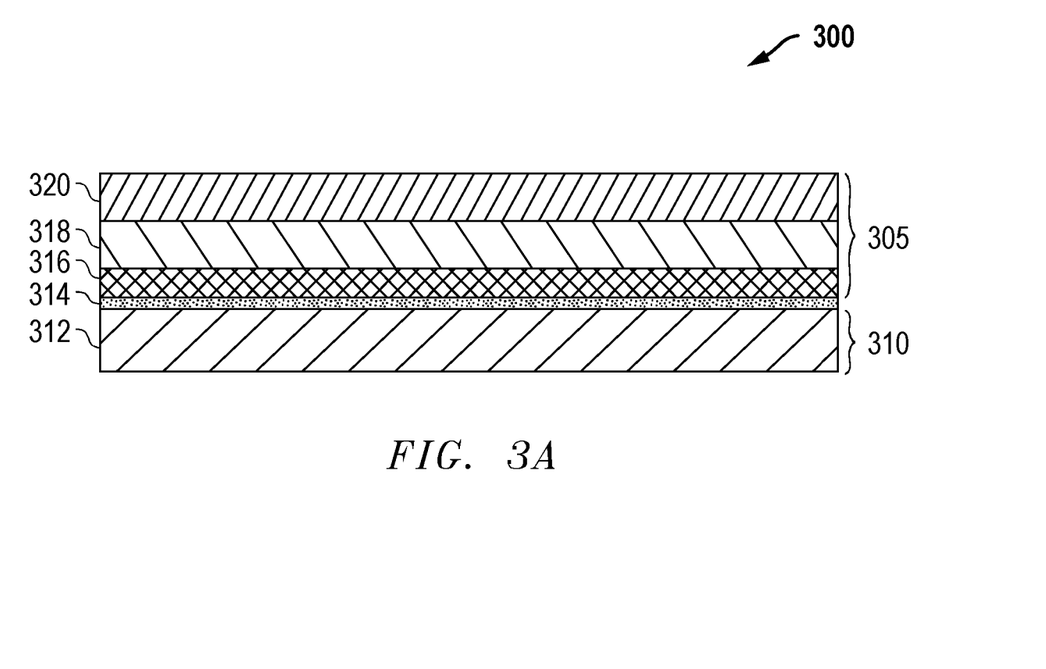
FIGS. 3A-3B illustrate an exemplary multi-substrate structure configured according to the techniques disclosed herein.

FIG. 3A illustrates an exemplary embodiment of a multi-substrate structure 300 and the resulting bonded substrates of a process such as seen in FIGS. 2A and 2B.

As shown in FIG. 3A, a multi-substrate structure 300 an upper substrate 305 (for example an upper wafer) has a front-side device area 316, a substrate body 318 (for example silicon) and a back-side device area 320. A lower substrate 310 (for example a lower wafer) is also provided. The upper substrate 305 and the lower substrate 310 are bonded together with a bonding silicon oxide layer 314. In the embodiment shown in FIG. 3A, the silicon oxide between the two substrates may be a low density silicon oxide. The bonding silicon oxide layer 314 may be considered to be a portion of the upper substrate, the lower substrate, or both. The bonding silicon oxide layer 314 may have been formed by a bonding process described above wherein a silicon oxide layer on an exposed surface of one or both of the substrates prior to bonding is used to bond the substrates together.

Figure 3B:
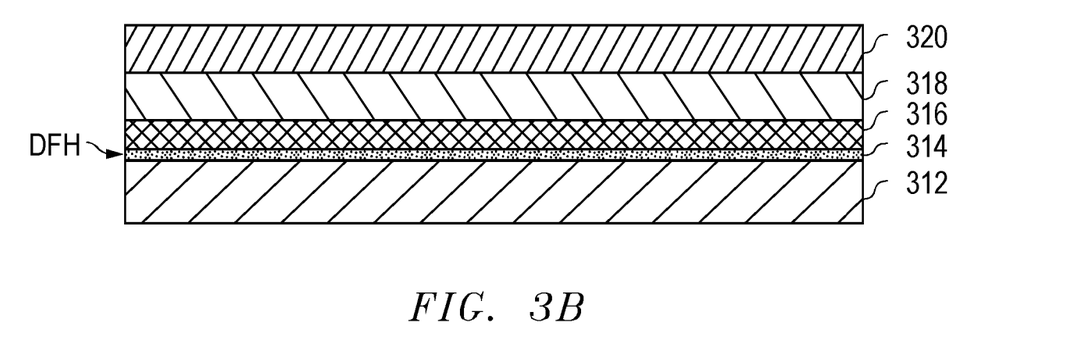

If it is desired to debond the two substrates of FIG. 3A, the substrates may be exposed to a wet diluted hydrofluoric acid (DHF). The DHF will provide a high etch rate of the bonding silicon oxide layer 314. Thus, as shown in FIG. 3B, the bonded substrates may be exposed to a DHF wet etch. The low density silicon oxide of the bonding silicon oxide layer 314 will have a high etch rate to the DHF and the DHF will act to remove the bonding silicon oxide layer 314. Upon removal of the bonding silicon oxide layer, the upper substrate 305 and the lower substrate 310 may then be easily separated. It will be recognized that the etchant does not have to be a wet etchant. For r example an HF vapor etch could be used. Alternatively, other silicon oxide etchants may be utilized. Further, depending upon the oxide utilized, etchants may also include phosphoric acid.

It will be recognized that the thicknesses of the oxide layers utilized to bonding the two substrates together may vary depending upon a particular application for use of the techniques disclosed herein. In one embodiment, the upper and lower substrates may each have an oxide in a thickness of less than 10 um and more particularly in a range of 5 um to 10 nm and even more particularly 500 nm to 100 nm.

Figure 4A:
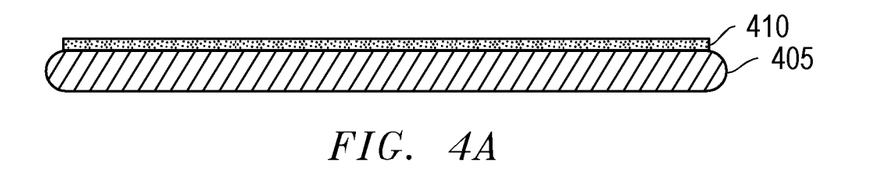
FIGS. 4A-4E illustrate an exemplary bonding and debonding process according to the techniques disclosed herein.
Figure 4B:
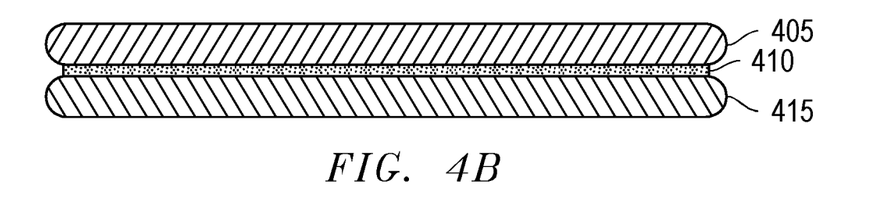
Figure 4C:
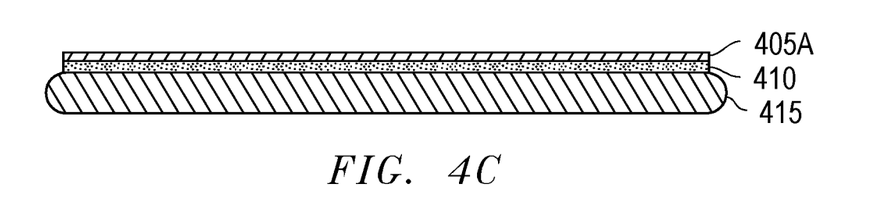
Figure 4D:
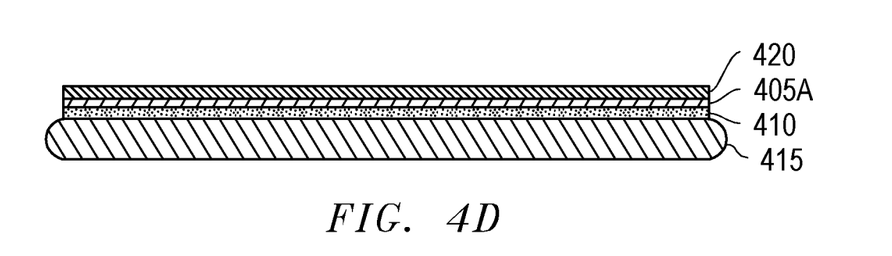
Figure 4E:
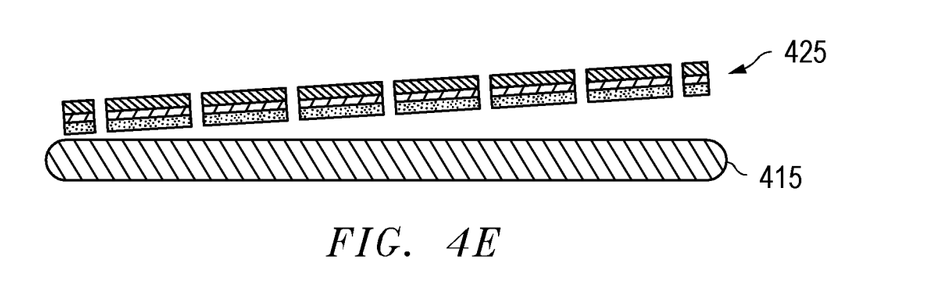

FIG. 4A illustrates an exemplary process flow utilizing the techniques disclosed herein. As shown in FIG. 4A, a first substrate 405 may be subjected to a variety of processing to form structures and devices thereon. For example, the substrate may be subjected to standard front end of line (FEOL) and/or back end of line (BEOL) semiconductor processing to form a FEOL/BEOL area 410 of the first substrate 405. The first substrate 405 may be the upper substrate in the examples of FIGS. 2A-3B. Next, the first substrate 405 may then have a silicon oxide layer formed thereon, in one embodiment a low density silicon oxide (not shown). Next as shown in FIG. 4B, the first substrate 405 may be flipped and bonded to a carrier substrate 415 (the carrier substrate may be the lower substrate of FIGS. 2-3B). The carrier substrate may also have a surface of silicon oxide as described above. The two substrates may then be fusion bonded, such as shown in FIG. 2A to provide a SI—O—Si bond connection between the two substrates. The first substrate 405 may then be subjected to any of a variety of substrate processing steps. For example, the first substrate 405 may be subjected to an edge trim, grinding, and/or chemical mechanical planarization (CMP) process steps to thin the first substrate 405 to a thinned first substrate 405A as shown in FIG. 4C. Then, any additional back-side processing may also be performed to form a back-side processed area 420 as shown in FIG. 4D. Finally, the first substrate 405 may be debonded from the carrier substrate 415 using the oxide etch debonding techniques described herein and the first substrate 405 may also be diced as shown in FIG. 4E.

As described in FIGS. 4A-4E, a process is provided in which the advantages of fusion processing may be obtained and utilized even for substrates that may subsequently be desired to be debonded. In the example of FIGS. 4A-4E, front-side processing of a substrate is performed and then the bonding of that substrate to a carrier wafer is performed so that back-side processing of the substrate may then occur. In the example shown, the substrate that is front-side processed is bonded to a carrier substrate and then after the back-side processing, the substrate is debonded.

The bonding and debonding technique may advantageously be utilized in a wide variety of applications and is not, however, limited to the example of FIGS. 4A-4E. Thus, the use of silicon oxide fusion bonding followed by debonding process which etches the silicon oxide may be used in a variety of other applications. In fact, a wide variety of processes in which it is desirable to fusion bond two substrates but subsequently debond the substrates may utilize the techniques described herein. Moreover, though described herein with regard to a silicon oxide layer(s) and a DHF etch, it will be recognized that other oxides and other etchants may be utilized. Thus, for example, other oxides than silicon oxide may be used for the bonding process and an appropriate etchant for those oxides may be used. Further, even for silicon oxide fusion bonding, the etchant is not limited to DHF as other silicon oxide etchants may be utilized. It will be recognized that after the debonding process, the substrate may be subjected to a clean process prior to further processing.

As mentioned above, in one embodiment a low density oxide may be used as part of the fusion bonding process. In one specific embodiment, the oxide may be a low density silicon oxide. As used herein, a low density silicon oxide may be an oxide having a density of 2 g/cm$^3$ or less. The use of a low density oxide is advantageous in that the etch characteristics of a low density oxide are such that the oxide may be more rapidly and easily removed. For example, low density silicon oxide may relatively easily be removed with DHF.

Figure 5:
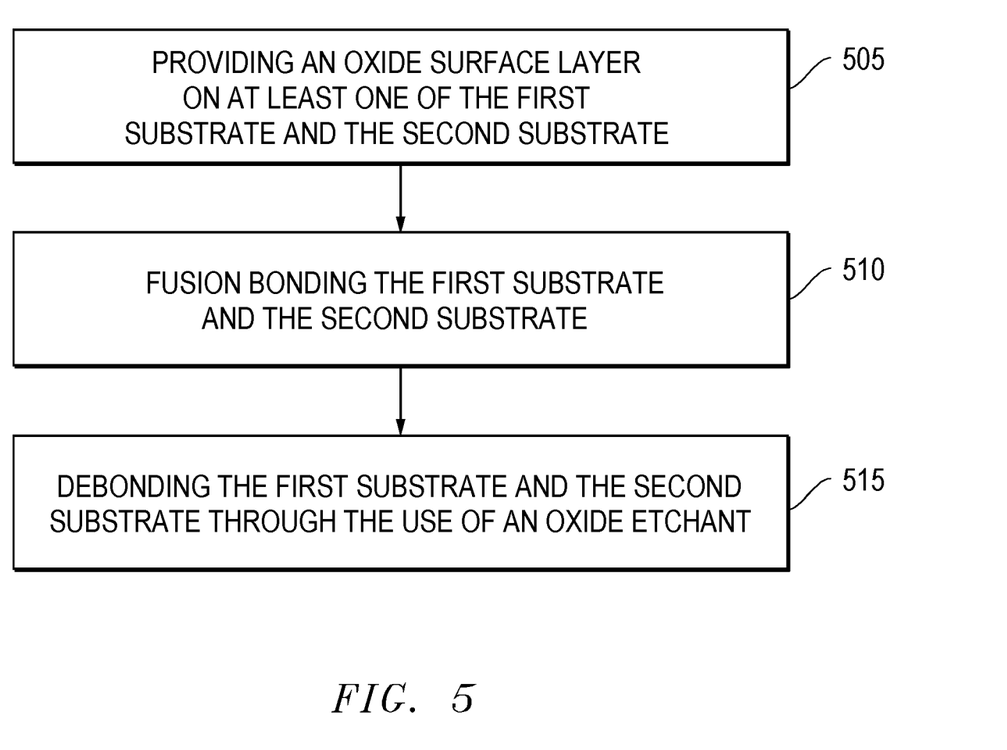
FIG. 5 illustrates an exemplary method for utilizing the bonding techniques disclosed herein.

FIG. 5 illustrate an exemplary method for use of the processing techniques described herein. It will be recognized that the embodiment of FIG. 5 is merely exemplary and additional methods may utilize the techniques described herein. Further, additional processing steps may be added to the method shown in the FIG. 5 as the steps described are not intended to be exclusive. Moreover, the order of the steps is not limited to the order shown in the figure as different orders may occur and/or various steps may be performed in combination or at the same time.

FIG. 5 illustrates a method for processing a first substrate and a second substrate. The method comprises a first step 505 of providing an oxide surface layer on at least one of the first substrate and the second substrate. The method further comprises step 510 of fusion bonding the first substrate and the second substrate. The method also comprises step 515 of debonding the first substrate and the second substrate through the use of an oxide etchant.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A method for processing a first substrate and a second substrate, comprising:
   processing a first side of the first substrate;
   providing an oxide surface layer on at least one of the first side of the first substrate or a first side of the second substrate;
   flipping the first substrate such that the first side of the first substrate faces the first side of the second substrate and a second side of the first substrate is exposed, and fusion bonding the first side of the first substrate and the first side of the second substrate;
   processing the second side of the first substrate after the fusion bonding; and
   after processing the second side of the first substrate, debonding the first substrate and the second substrate through the use of an oxide etchant.

2. The method of claim 1, wherein the oxide surface layer comprises silicon oxide having a density of 2 g/cm$^3$ or less.

3. The method of claim 2, wherein the oxide etchant comprises hydrofluoric acid.

4. The method of claim 3, wherein the oxide etchant comprises diluted hydrofluoric acid.

5. The method of claim 1, wherein the first side of the first substrate has a first oxide surface layer and the first side of the second substrate has a second oxide surface layer.

6. The method of claim 5, wherein the first oxide surface layer comprises a silicon oxide having a density of 2 g/cm$^3$ and the second oxide surface layer comprises a silicon oxide having a density of 2 g/cm$^3$.

7. The method of claim 6, wherein the fusion bonding forms Si—O—Si bonds between the first side of the first substrate and the first side of the second substrate.

8. The method of claim 7, wherein the oxide etchant comprises a wet oxide etchant.

9. The method of claim 8, wherein the oxide etchant comprises hydrofluoric acid.

10. The method of claim 1, wherein the oxide etchant comprises a wet oxide etchant.

11. The method of claim 1, wherein the fusion bonding forms Si—O—Si bonds between the first side of the first substrate and the first side of the second substrate.

12. The method of claim 11, wherein the oxide etchant comprises hydrofluoric acid.

13. The method of claim 1, wherein the processing of the second side of the first substrate thins the first substrate.

14. The method of claim 1, wherein the processing of the second side of the first substrate includes at least one of an edge trim, grinding, and/or chemical mechanical planarization.

15. The method of claim 14, wherein the oxide surface layer includes a material comprising silicon and oxygen and has a density of 2 g/cm$^3$ or less.

16. The method of claim 15, wherein the first side of the first substrate is a front side and the second side is a back side, and wherein the oxide surface layer is silicon oxide having the density of 2 g/cm$^3$ or less and the surface layer has a thickness of 10 μm or less, and wherein the silicon oxide is provided on both the front side of the first substrate and the first side of the second substrate.

17. A method for processing substrates comprising:
providing a first substrate having a front side and a back side, the front side having one or more semiconductor processing layers thereon
providing a second substrate having one side which is to be bonded to the first substrate;
providing a bonding layer on at least one of the first substrate or the second substrate, the bonding layer formed of a material including silicon and oxygen and having a density of 2 g/cm$^3$ or less;
fusion bonding the front side of the first substrate to the one side of the second substrate using the bonding layer;
processing the back side of the first substrate; and
debonding the front side of the first substrate from the one side of the second substrate.

18. The method of claim 17, wherein the bonding layer is silicon oxide having the density of 2 g/cm$^3$ or less, and a thickness of 10 μm or less and provided on each of the one side of the second substrate and the front side of the first substrate.

19. The method of claim 18, wherein the processing of the back side of the first substrate thins the first substrate.

20. The method of claim 18, further including flipping the first substrate after providing the bonding layer and before the fusion bonding, and wherein the processing the back side of the first substrate comprises at least one of an edge trimming, grinding and/or chemical mechanical planarization.

* * * * *

UNITED STATES PATENT AND TRADEMARK OFFICE
CERTIFICATE OF CORRECTION

| | |
|---|---|
| PATENT NO. | : 11,315,789 B2 |
| APPLICATION NO. | : 16/573775 |
| DATED | : April 26, 2022 |
| INVENTOR(S) | : Kiyotaka Imai |

Page 1 of 1

It is certified that error appears in the above-identified patent and that said Letters Patent is hereby corrected as shown below:

On the Title Page

Item [56], (Page 2), delete "2019/0043914 A1 2/2019 Von" and insert --2019/0043914 A1 2/2019 Von Kanel--.

Signed and Sealed this
Thirtieth Day of August, 2022

Katherine Kelly Vidal
*Director of the United States Patent and Trademark Office*